(12) United States Patent
Greenberg et al.

(10) Patent No.: US 8,541,069 B2
(45) Date of Patent: Sep. 24, 2013

(54) METHOD OF GUIDED NON-LINE OF SIGHT COATING

(75) Inventors: Michael D. Greenberg, Bloomfield, CT (US); Benjamin J. Zimmerman, Enfield, CT (US)

(73) Assignee: United Technologies Corporation, Hartford, CT (US)

( * ) Notice: Subject to any disclaimer, the term of this patent is extended or adjusted under 35 U.S.C. 154(b) by 168 days.

(21) Appl. No.: 13/083,727

(22) Filed: Apr. 11, 2011

(65) Prior Publication Data

US 2012/0258256 A1 Oct. 11, 2012

(51) Int. Cl.
*C23C 14/28* (2006.01)

(52) U.S. Cl.
USPC .................. 427/595; 427/596; 427/597

(58) Field of Classification Search
USPC ............................ 427/595, 596, 597
See application file for complete search history.

(56) References Cited

U.S. PATENT DOCUMENTS

| | | | |
|---|---|---|---|
| 3,661,117 A | 5/1972 | Cornelius et al. | |
| 3,889,019 A | 6/1975 | Blecherman et al. | |
| 5,534,314 A | 7/1996 | Wadley et al. | |
| 5,716,720 A * | 2/1998 | Murphy | 428/623 |
| 5,720,821 A | 2/1998 | Halpern | |
| 6,210,744 B1 | 4/2001 | Hayess et al. | |
| 6,478,931 B1 | 11/2002 | Wadley et al. | |
| 6,576,062 B2 | 6/2003 | Matsuse | |
| 6,911,234 B2 | 6/2005 | Warnes et al. | |
| 7,014,889 B2 | 3/2006 | Groves et al. | |
| 7,128,750 B1 * | 10/2006 | Stergiopulos | 606/158 |
| 7,422,671 B2 | 9/2008 | Bhatia et al. | |
| 7,476,450 B2 | 1/2009 | Maloney et al. | |
| 7,498,587 B2 | 3/2009 | Welty | |
| 7,718,222 B2 | 5/2010 | Hass et al. | |
| 2003/0054133 A1 | 3/2003 | Wadley et al. | |
| 2003/0207031 A1 * | 11/2003 | Strangman et al. | 427/255.32 |
| 2004/0089232 A1 | 5/2004 | Sasaki et al. | |
| 2004/0134430 A1 | 7/2004 | Hass et al. | |
| 2005/0000444 A1 * | 1/2005 | Hass et al. | 118/723 EB |
| 2005/0034669 A1 * | 2/2005 | Movchan et al. | 118/723 EB |
| 2005/0221618 A1 * | 10/2005 | AmRhein et al. | 438/710 |
| 2008/0057195 A1 | 3/2008 | Schlichting | |

(Continued)

FOREIGN PATENT DOCUMENTS

| | | |
|---|---|---|
| DE | 102004017646 A1 | 10/2005 |
| EP | 1816232 A1 | 8/2007 |

(Continued)

OTHER PUBLICATIONS

Yi, Jian, et al., "Electron beam-physical vapor deposition of SiC/SiO2 high emissivity thin film." Applied Surface Science 253 (2007) 4361-4366.*

(Continued)

*Primary Examiner* — Bret Chen
(74) *Attorney, Agent, or Firm* — Kinney & Lange, P.A.

(57) ABSTRACT

A method for applying a vapor deposition coating onto a substrate with a non line of sight or limited line of sight is disclosed. A vapor stream is provided in a chamber that is below atmospheric pressure. The vapor stream is impinged with a working gas that provides a flow that transports the vapor stream. The flow of the working gas is modified with a physical object that directs the flow to achieve a desired coating on the substrate.

11 Claims, 4 Drawing Sheets

(56) References Cited

U.S. PATENT DOCUMENTS

2008/0292903 A1    11/2008  Milleville et al.
2009/0259076 A1*   10/2009  Simmons et al. ............ 568/671
2011/0167634 A1*    7/2011  Milleville et al. ............ 29/889.1

FOREIGN PATENT DOCUMENTS

| WO | WO0190438 A1 | 11/2001 |
| WO | WO02087787 A1 | 11/2002 |
| WO | WO03020999 A1 | 3/2003 |
| WO | WO03028428 A3 | 4/2003 |
| WO | 2005085743 A1 | 9/2005 |

OTHER PUBLICATIONS

Almeida, D. S., et al "Thermal barrier coating by electron beam-physical vapor deposition of zirconia co-doped with yttria and niobia." J. Aerosp. Technol. Manag., Sao Jose dos Campos, vol. 2, No. 2, pp. 195-202, May-Aug. 2010.*

Golub, O.V., et al., "Modeling of the Formation of a Vapor Cloud in a Wind Flow with Intense Evaporation". Journal of Engineering Physics and Thermophysics, vol. 83, No. 4, 2010, pp. 809-814.*

The European Search Report mailed Jul. 3, 2012 for European Application No. 12162768.1.

* cited by examiner

METHOD OF GUIDED NON-LINE OF SIGHT COATING

BACKGROUND

The present invention provides a method and an apparatus for applying a coating to a surface using a directed vapor deposition (DVD) approach, and more particularly applying a directed coating to the line of sight region as well as non-line of sight and limited line of sight regions of a substrate.

The application of a coating to a substrate is required in a wide variety of engineering applications, including thermal or environmental protection, improved wear resistance, altered optical or electronic properties, decorative, biocompatibility, etc. In each of these cases, the ability to deposit compositionally controlled coatings efficiently, uniformly, at a high rate, with a high part throughput, and in a cost effective manner is highly desired As stated above, the ability to uniformly deposit ceramic or metallic coatings onto substrates is desirable for a number of applications. They include the deposition of metal on fibers to create metal matrix composites, deposition of coatings having low shear resistance and good thermochemical stability on the fibers used in ceramic matrix composites and the deposition of metals on sacrificial fiber templates to create hollow fibers. More generally, vapor deposition approaches which allow the creation of conformal coatings on a variety of non-planar substrates is also of interest. For example, the deposition of reaction inhibiting coatings onto the surfaces of a multi-airfoil vane segment for a gas turbine engine.

Several options for creating coatings of this type exist. These include chemical vapor deposition (CVD), electroplating processes and physical vapor deposition (PVD) approaches (such as electron beam evaporation or inverted cylindrical magnetron sputtering). However, despite the many needs, the advancement of processing approaches for these applications above are limited by several factors; namely, the inability to uniformly coat such substrates without sophisticated substrate translation and rotation capabilities, the inability to deposit metal, alloys and ceramics with the same process, the inability to create a coating with the desired microstructure, and low deposition rates which often limit high volume throughputs.

In CVD, uniform coating thicknesses are readily produced in some cases. However, the deposition rates can be low and the process often requires the use of toxic (and expensive) precursor materials. The deposition of multicomponent alloys can also be challenging. Electroplating can provide uniform coating over the surface of complex shaped parts. Although useful for depositing elemental layers, this process is less suitable for the creation of alloy or ceramic coatings.

In PVD approaches vapor atoms are created in high vacuum and deposited onto a substrate. One method to created vapor atoms is sputtering. A wide variety of materials can be deposited, but deposition rates are low. The high vacuums employed in these techniques result in few collisions with the background gas resulting in "line-of-sight" coating. Thus, substrate manipulation and/or shadowing is required to achieve acceptable coating uniformity on non-planar surfaces. Higher deposition rates require more energetic/higher density plasma sputtering (e.g. magnetrons).

Atomic vapor can be more rapidly created using electron beam evaporation approaches. However, the materials utilization efficiency (MUE) of electron beam physical vapor deposition is often low. When a relatively long source to substrate distances is required, the deposition efficiency can be low and the deposition rate limited. The high vacuum environments required for the creation of electron beam also lead to line of sight coating.

Electron beam-physical vapor deposition (EB-PVD) is a widely used method for the high-rate production of atomic and molecular vapor (metal or ceramic) for vapor deposition of a coating. During EB-PVD, vapor is transported to a substrate under high vacuum conditions where it condenses on surfaces that are in the line-of-sight of the vapor cloud source. This requires the use of complicated translation and rotation systems and shadowing to deposit a uniform coating onto complex or non linear structures that contain areas not in line of sight of the vapor stream. Even with known methods and equipment, EB-PVD processes often fail to create uniform coating thicknesses on difficult to coat locations of a substrate, i.e., non-line of sight and limited line of sight areas.

Electron beam—physical vapor deposition (EB-PVD) of metal and ceramic coatings can be quite costly to apply due to high equipment cost, low deposition efficiencies and relatively low deposition rates. The high equipment costs of EB-PVD are a result of the high vacuum environment, which is necessary during deposition, the high cost of high power electron beam guns, and the sophisticated component manipulation systems needed to achieve uniform coating on non-planar substrates. The operating pressure defines the vacuum pump requirements with lower pressures generally needing more expensive pumps. The low deposition rate and low materials utilization efficiency (MUE) of EB-PVD is related to the distribution of vapor cloud as it leaves the evaporated source. When relatively long source-to-substrate distances are required, the deposition efficiency is dramatically reduced.

Low deposition efficiencies result from cloud spreading beyond the periphery of the substrate and non line-of-sight deposition. One approach to reduce the spread of the cloud exploits entrainment of the vapor on a controllable inert (e.g. helium or argon) carrier gas flow. Such an approach is used in electron beam—directed vapor deposition (EB-DVD). In this approach, the combination of a continuously operating electron beam gun (modified to function in a low vacuum environment) and an inert carrier gas jet. In this system, the vapor plume is intersected with a rarefied trans- or supersonic inert gas jet, to entrain the evaporated cloud in a non-reacting gas flow and transport it to a substrate under low vacuum conditions. Deposition of the atomistic cloud then occurs by gas phase scattering from the streamlines of the flow and is deposited onto the substrate at high rates and with high materials utilization efficiency. However, this process may still result in unacceptable non-uniform deposition of coatings, especially when comparing line of sight to non line of sight areas. In addition, current systems of this type require the use of large amounts of gas, which results in substantial costs associated with the procurement of the gas as well as costs associated with the pumping capacity.

SUMMARY

Disclosed is a method for applying at least one coating on a substrate. The substrate is placed into a chamber with at least one evaporant source, which is impinged with an electron beam in the chamber to generate an evaporated vapor cloud. A one carrier gas stream is presented into the chamber to disperse the evaporated vapor cloud. The evaporated vapor cloud being moved by the carrier gas stream is deflected, wherein the deflecting is done with at least one physical article that disrupts a flow of the at least one carrier gas stream. The evaporated vapor cloud at least partially coats at the at least one substrate.

In another embodiment, an apparatus for applying at least one coating on at least one substrate is disclosed. The apparatus has a chamber operating pressure below atmospheric pressure, with the substrate present in said chamber, an evaporant source disposed in the chamber, an electron beam generator that impinges the at least one said evaporant source with an electron beam in the chamber to generate an evaporated vapor cloud, a carrier gas stream source for introducing a carrier gas into the chamber that transports the evaporated vapor cloud to coat the at least one substrate, and at least one physical flow disrupting object that modifies a flow of the carrier gas to direct the deposition of the evaporated vapor cloud in a desired pattern on the substrate.

In yet another embodiment, a method for applying a vapor deposition coating onto a substrate with a non line of sight or limited line of sight is disclosed. A vapor stream is provided in a chamber that is below atmospheric pressure. The vapor stream is impinged with a working gas that provides a flow that transports the vapor stream. The flow of the working gas is modified with a physical object that directs the flow to achieve a desired coating on the substrate.

DETAILED DESCRIPTION

Figure 1:
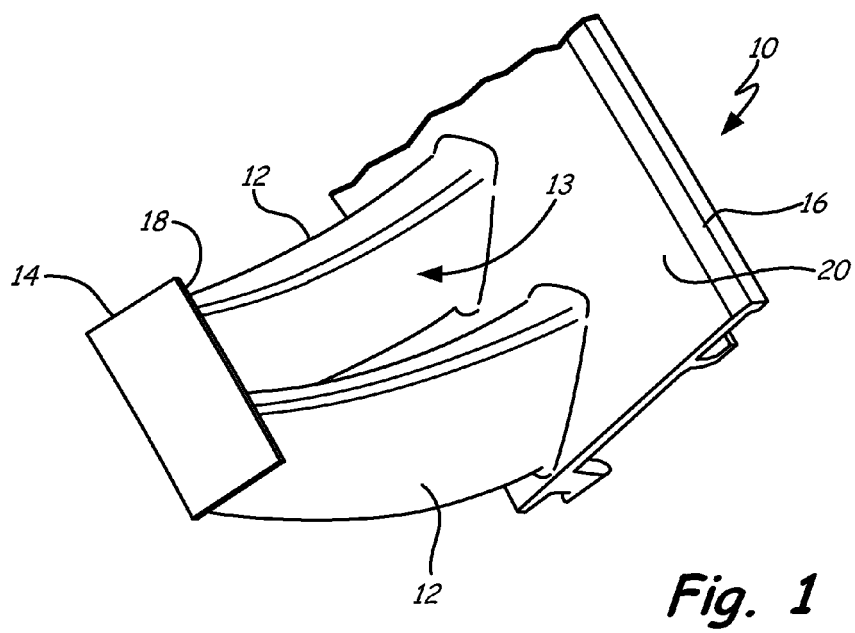
FIG. 1 is a perspective view of a prior art multi-airfoil vane segment of a gas turbine engine.

FIG. 1 is a perspective view of a prior art multi-airfoil vane segment 10 of a gas turbine engine. Multi-airfoil vane segment 10 contains a plurality of airfoils 12 between inner shroud 14 and outer shroud 16. The surfaces of airfoils 12 and inner surfaces 18 and 20 of inner and outer shroud 14 and 16, respectively, are covered at least partially with a thermal barrier coating (TBC). The TBC protects multi-airfoil vane segment 10 from the hot gases from the turbine engine, and coating the multi-airfoil vane segment 10 increases the life of the part by preventing failure due to oxidation and thermal mechanical fatigue.

The geometry of multi-airfoil vane segment 10 creates some obstacles for manufacturing, including the application of the TBC, as airfoils 12 and shrouds 14 and 16 prevent direct line of sight of the entire part during TBC application. This is especially apparent when utilizing electron beam physical vapor deposition (EB-PVD). The geometry results in a non-line of sight area 13 of multi-airfoil vane segment 10.

The non-line of sight coating system described herein provides improved resistance to oxidation and thermal mechanical fatigue by comprehensively applying a thermal barrier coating to a workpiece. The workpiece is positioned within a chamber that is maintained at a low pressure by a vacuum pumping system. A fixture positions the workpiece adjacent a vapor source and a gas source. The vapor source introduces a vapor cloud into the housing toward the line of sight regions of the part. A gas is introduced into the housing by a plurality of nozzles. As the vapor cloud and the gas interact, particle-to-particle collisions cause randomization of the vapor cloud and push the vapor cloud toward the workpiece. Thus, the coating system coats the line of sight regions of the workpiece in the path of the flow of the inert gas. However, non-line of sight area 13 does not obtain the same coverage as the line of sight areas, which are in the direct flow paths of the vapor cloud and inert gas mixture. Non-line of sight area 13 includes the area between airfoils 12 and inner and outer shrouds 14 and 16. Although some of the vapor cloud will contact the non-line of sight areas, the thickness of the resultant coating will not be the same as the thickness of the coating applied to line of sight areas.

Figure 2:
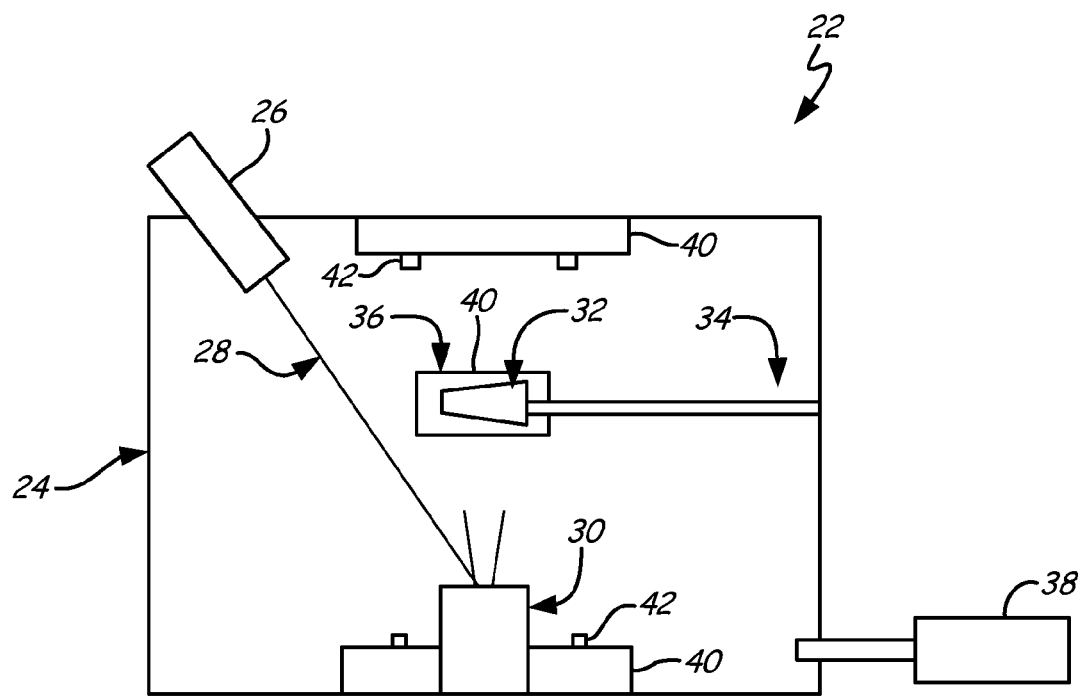
FIG. 2 is a schematic of a vapor deposition system.

FIG. 2 illustrates a schematic of a vapor deposition system 22 for applying TBC to multi-airfoil vane segment 10. The apparatus illustrated allows for non-line of sight and limited line of sight application of TBC to multi-airfoil vane segment 10. Vapor deposition system 22 includes chamber 24, energetic source 26 to produce beam 28, evaporate material 30, workpiece 32 supported by fixture system 34, vapor cloud modifier 36, vacuum system 38, and fluid generator 40 with nozzles 42. Vapor deposition system 22 may be utilized to apply one or more coatings, including multilayer coatings, of ceramic base or metallic base, or a combination thereof.

Vapor deposition system 22 vaporizes evaporate material 30 with beam 28 of energetic source 26, such as a continuous high voltage and medium power axial e-beam gun. In alternate embodiments, energetic source 26 with beam 28 is an electron beam, laser source, heat source, ion bombardment source, or highly focused incoherent light source. The vaporized material will coat workpiece 32, which acts as a substrate.

Evaporate material 30 is any material used to create a desire coating, such as a TBC. Evaporate material 30 may be one or more barrier layers applied to workpiece 32, and may be any of the barrier layers from the group consisting of yttrium monosilicate, yttrium disilicate, rare-earth silicates, alkaline-earth aluminosilicates such as barium-strontium-aluminosilicate, niobium oxide, tantalum oxide, zirconium oxide, hafnium oxide, yttrium oxide, titanium oxide, mullite, rare-earth oxides, and mixtures and compounds thereof, and a variety of metal sources including aluminum, chromium, tantalum, niobium, silicon, molybdenum, hafnium, titanium, zirconium, platinum, palladium, gold, or mixtures and alloys thereof. These coatings form over the substrate of workpiece 32, which may be manufactured from a variety of metal, metal alloys, or composites.

The vaporization of evaporate material 30 takes place within chamber 24. In one embodiment, chamber 24 is a hermetic housing that partially or completely encloses energetic source 26 and beam 28, evaporate material 30, workpiece 32 supported by fixturing system 34, and vapor cloud modifier 36. Chamber 24 may be constructed from metals, polymers or glass, and contain a transparent section to view the process taking place therein. Vacuum system 38 is connected to chamber 24, and maintains the pressure within chamber 24 below atmospheric pressure. In one embodiment, vacuum system 38 is capable of maintaining the pressure within chamber 24 at any point between $1\times10^{-8}$ kPa and 101 kPa.

Chamber 24 is also connected to fluid generator 40. Fluid generator 40 provides a stream of fluid through nozzles 42 that mixes with and directs the vapor created from evaporate material 30. As the fluid contacts the vapor, the fluid causes particle-to-particle interaction and increases randomization within the vapor cloud, as well as directing the vapor cloud movement within chamber 24. Due to the vacuum created by vacuum system 38, the fluid from fluid generator is introduced into chamber 24 at a relatively low pressure. Nozzles 42 may introduce the fluid at any number of points in chamber 24 to create a desired flow and movement of the vapor created from evaporate material. The fluid is a carrier gas. In one embodiment, the fluid from fluid generator 40 is an inert gas, such as a noble gas. In alternate embodiments, the fluid is a gas such as helium, argon, oxygen, nitrogen, hydrocarbons, silanes, or a combination of any of the aforementioned gases.

Workpiece 32 is present within chamber 24 and held by fixture system 34. Fixture system 34 may include a series of clamps, screws, and similar structures to secure the workpiece 32 within chamber 24. In one embodiment, fixture system 34 is connected to a movable system that enables shift of the workpiece in any independent direction. Alternately, fixture system 34 may contain a rotatable shaft. In these embodiments, the translation motion from the fixture system 34 allows for exposing different surfaces of workpiece 32 to control the thickness of the application of a coating. Additionally, fixture system 34 can be used to keep a constant distance between workpiece 32 and the source of the vapor cloud applying the coating. Fixture system 34 is used to assure all line of sight areas are evenly coated through translation of workpiece 32 during the application process. Despite such a design of fixture system 32, some part geometries result in non-line of sight or limited line of sight areas, such as the multi-airfoil vane segment 10, that are not able to be moved into the line of sight of the vapor cloud produced by vapor deposition system 22.

Vapor cloud modifier 36 is also present in chamber 24. Vapor cloud modifier is a physical object that disrupts the flow of the vapor cloud, either by inhibiting flow or modifying and redirecting the flow of the carrier gas generated by fluid generator 40 with nozzles 42. The modification of the flow of the carrier gas affects the deposition of the coating on the substrate of workpiece 32. In some embodiments, vapor cloud modifier 36 may be used to thicken the coating on a non line of sight or limited line of sight area of workpiece 32, while in alternate embodiments vapor cloud modifier 36 is used to reduce the coating coverage on a line of sight area of workpiece 32.

Figure 3:
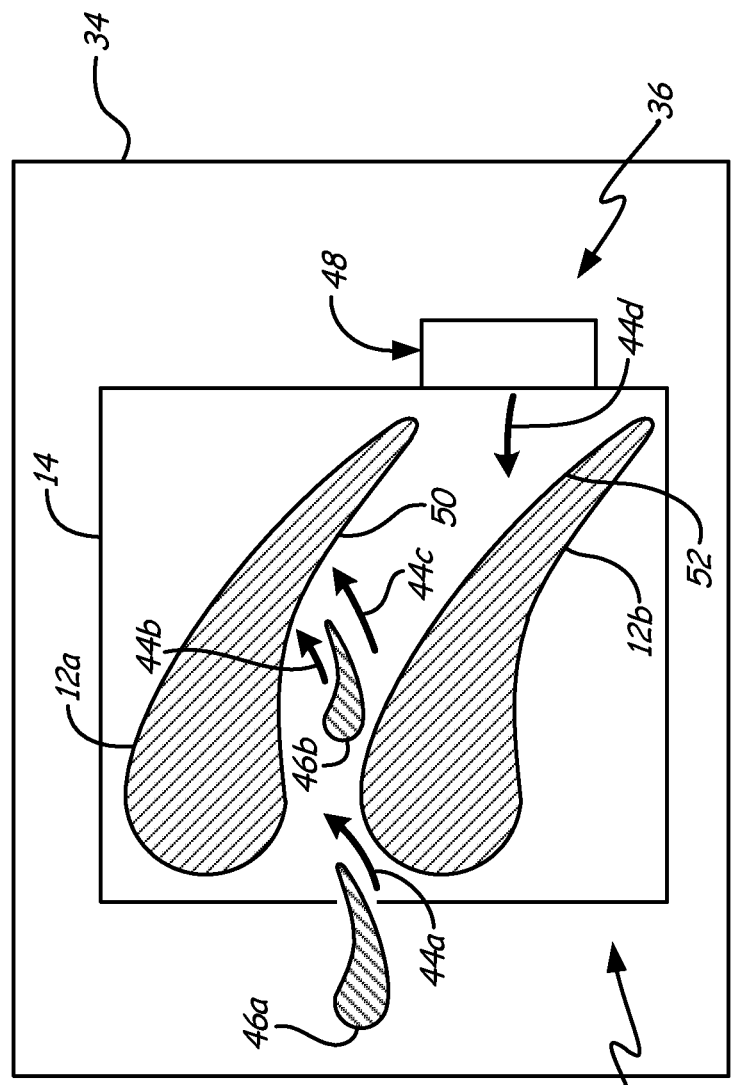
FIG. 3 is a schematic of a workpiece and vapor cloud modifiers.

FIG. 3 is a top plan schematic of workpiece 32 and vapor cloud modifier 36 in the path of vapor cloud 44. Vapor cloud 44 is comprised of evaporated material 30 and carrier gas from fluid generator 40. In this embodiment, vapor cloud modifier 36 contains flow modifiers 46a and 46b and flow inhibitor 48.

Flow modifiers 46a and 46b are generally airfoil shaped. Flow modifier 46a will direct the flow of vapor cloud 44 to the gap between airfoils 12a and 12b, and towards flow modifier 46b, as represented by 44a. Flow modifier 44b again redirects the flow, represented by 44b and 44c, to enhance the coating of inner side 50 of airfoil 12a. As some of the flow of vapor cloud 44 continues through the gap created by airfoils 12a and 12b, the flow will contact flow inhibitor 48. Flow inhibitor 48 will impede the flow and redirect it back towards the outer side 52 of airfoil 12b. Thus, the application of the coating being deposited by vapor cloud 44 will be more uniformly dispersed on workpiece 32. In an alternate embodiment, the flow modifiers are minors of 46a and 46b, and the flow is directed towards the outer side of airfoil 12b. Although illustrated as a cross section, the flow modifiers 46a and 46b are three dimensional, and may contain features that modify the flow to enhance or prohibit the coating of the shrouds 14 and 16.

Figure 4:
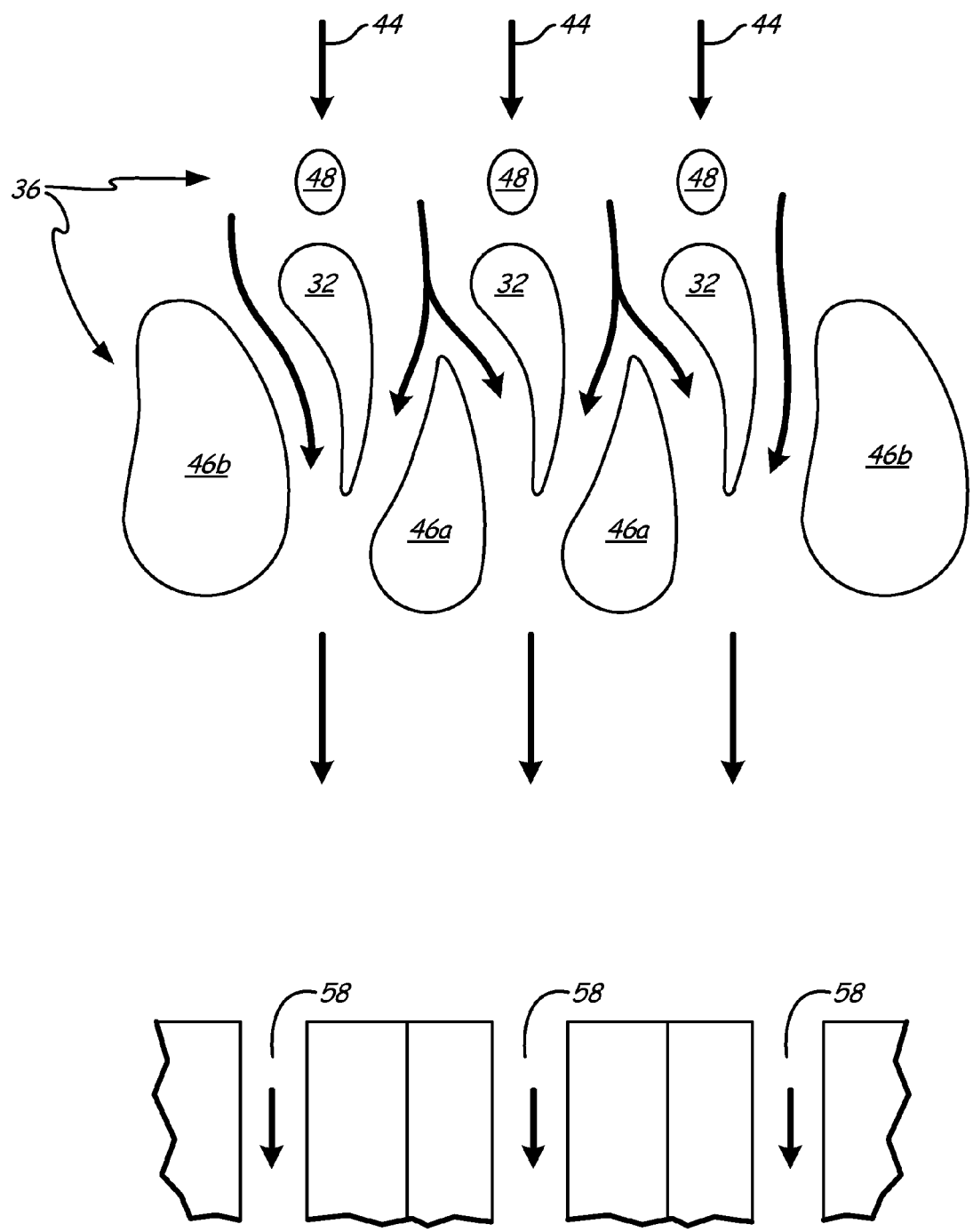
FIG. 4 is a cross-sectional plan view of workpieces and vapor cloud modifiers.

FIG. 4 is a cross-sectional plan view of workpieces 32 and vapor cloud modifiers 36 in the flow path of vapor cloud 44. In this embodiment, three airfoil shaped workpieces 32 are to be coated by vapor cloud 44. Vapor cloud modifiers 36 in the form of flow inhibitors 48 and flow modifiers 46a and 46c. In this embodiment, flow inhibitors 48 are cylindrical pegs placed adjacent the leading edges of the airfoils of workpieces 32. Flow inhibitors 48 will block and redirect the flow of vapor cloud 44, thus reducing the amount of coating deposited on the leading edge of the airfoils of workpieces 32. Flow modifiers 46a are shaped like airfoils, and in one embodiment have the same dimensions as the dimensions of workpieces 32. Flow modifiers 46c are illustrated as containing alternate dimensions and shapes, which may be of any dimension so long as the dimension adjacent workpieces 32 provides the desired flow for creating the coating on workpieces 32 from vapor cloud 44. The remaining vapor cloud 44 will pass workpieces 32, flow inhibitors 48, and flow modifiers 46 and be exhausted through openings 58.

Vapor cloud modifiers 36 (including flow modifiers 46 and flow inhibitors 48) may be of any dimension so long as the resultant flow of the carrier gas that creates vapor cloud 44 is disrupted to achieve the desire result. In one embodiment, vapor cloud modifiers 36 are constructed from the same material as the substrate of workpiece 32. In alternate embodiments, various metals, alloys, composites, or any combination thereof is utilized in construction of the vapor cloud modifiers 36.

Vapor cloud modifiers 36 may be located throughout chamber 24. In one embodiment, vapor cloud modifiers are located on fixture system 34. As fixture system 34 is moved, vapor cloud modifiers 36 also move in the same manner. In an alternate embodiment, vapor cloud modifiers 36 move independent of the motion of fixture system 34. Vapor cloud modifiers 36 may be independent of fixture system 34. Again, vapor cloud modifiers 36 that are separate from fixture system 34 may move in concert with fixture system, or move independent from fixture system 34. Vapor cloud modifiers may be constructed to be removed when not in used or needed, thus being present only for a portion of the application of one or more coatings. In all embodiments, vapor cloud modifiers 36 are removable from chamber 24 for replacement as build of coating on the vapor cloud modifiers may alter intended flow properties of vapor cloud 44.

The presence of vapor cloud modifiers 36 in chamber 24 may also be utilized to change process parameters in the coating process. In one embodiment, vapor cloud modifiers allow for an increase in the flow of carrier gas to further improve the coating of non line of sight areas.

Alternately, vapor cloud modifiers 36 contain an additional property that affects the flow of the carrier gas, and thus vapor cloud 44, aside from the geometry and dimensions of the objects. In one embodiment, vapor cloud modifiers 36 are electrically biased to attract or repel more of an ionized vapor cloud. In alternate embodiments, vapor cloud modifiers may be magnetized, ionized, heated, or cooled. Additionally, vapor cloud modifiers 36 may contain apertures that allow for the venting of or introduction of the carrier gas to modify the flow of the vapor cloud. All of these embodiments may affect the coating process parameters in chamber 24, and one or more of the embodiments may be utilized for vapor cloud modifiers.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method for applying a coating on substrate, the method comprising:
   placing the substrate into a chamber;
   impinging an evaporant source in the chamber with a beam to generate an evaporated vapor cloud in the chamber; and
   presenting a carrier gas stream to the chamber to disperse the evaporated vapor cloud;
   deflecting the evaporated vapor cloud being moved by the carrier gas stream, wherein the deflecting is done with at least one vapor cloud modifier that disrupts a flow of the carrier gas stream that prevents an area of the substrate from being coated, and wherein the evaporated vapor cloud at least partially coats at the substrate.

2. The method of claim 1 wherein the at least one vapor cloud modifier is positioned to enhance the coverage of an area of the substrate by the evaporated vapor cloud.

3. The method of claim 1 wherein the at least one vapor cloud modifier comprises an airfoil.

4. The method of claim 1 wherein the substrate contains a non line of sight feature.

5. The method of claim 4 wherein the substrate is a multi-airfoil vane segment for a gas turbine engine.

6. The method of claim 5 wherein the coating is a thermal barrier coating.

7. A method for applying vapor deposition onto a substrate with a non line of sight or limited line of sight comprising:
   providing a vapor stream in a chamber, wherein the chamber is below atmospheric pressure;
   impinging the vapor stream with a working gas that provides a flow that transports the vapor stream;
   modifying a flow of the working gas with a physical object that directs the flow to achieve a desired coating on the substrate, wherein the physical object that directs the flow prevents an area of the substrate from being coated.

8. The method of claim 7 wherein the physical object that directs the flow enhances the coverage of an area of the substrate by the vapor stream being carried by the working gas.

9. The method of claim 7 wherein the physical object has an airfoil shape.

10. The method of claim 7 wherein the substrate is a multi-airfoil vane segment for a gas turbine engine.

11. The method of claim 10 wherein the coating is a thermal barrier coating.

* * * * *